(12) United States Patent
Lee et al.

(10) Patent No.: US 7,651,079 B2
(45) Date of Patent: Jan. 26, 2010

(54) SUBSTRATE SUPPORT PLATE TRANSFER APPARATUS FOR FABRICATING ORGANIC LIGHT EMITTING DISPLAY

(75) Inventors: Ji Yong Lee, Kyunggi-do (KR); Kwan Seop Song, Kyunggi-do (KR); Hee Cheol Kang, Kyunggi-do (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 427 days.

(21) Appl. No.: 11/489,646

(22) Filed: Jul. 18, 2006

(65) Prior Publication Data
US 2007/0022895 A1     Feb. 1, 2007

(30) Foreign Application Priority Data
Jul. 29, 2005    (KR) ............... 10-2005-0069815

(51) Int. Cl.
*B25B 11/00*    (2006.01)
(52) U.S. Cl. ........................... 269/21; 269/900
(58) Field of Classification Search ............ 269/21, 269/60, 37, 75, 900
See application file for complete search history.

(56) References Cited

U.S. PATENT DOCUMENTS

| | | | | |
|---|---|---|---|---|
| 3,155,383 | A | * | 11/1964 | Whitmore .................. 269/58 |
| 3,787,039 | A | * | 1/1974 | Zeichman .................. 269/13 |
| 4,409,860 | A | * | 10/1983 | Moriyama et al. ........ 74/490.09 |
| 4,768,698 | A | * | 9/1988 | Brown et al. .............. 228/18 |
| 4,896,869 | A | * | 1/1990 | Takekoshi ................. 269/60 |
| 5,022,619 | A | * | 6/1991 | Mamada ................. 248/187.1 |
| 5,760,564 | A | * | 6/1998 | Novak ..................... 318/687 |
| 5,996,437 | A | * | 12/1999 | Novak et al. ............. 74/490.09 |
| 6,615,477 | B2 | * | 9/2003 | Oshima .................... 29/559 |
| 2004/0107911 | A1 | | 6/2004 | Hur et al. |
| 2007/0022895 | A1 | * | 2/2007 | Lee et al. ................. 101/494 |

FOREIGN PATENT DOCUMENTS

| CN | 1456036 | 11/2003 |
|---|---|---|
| JP | 2001-168182 | 6/2001 |
| JP | 2003-017257 | 1/2003 |

(Continued)

OTHER PUBLICATIONS

Patent Gazette issued on Sep. 17, 2008 by the State Intellectual Property Office of P.R.C.

(Continued)

*Primary Examiner*—Lee D Wilson
(74) *Attorney, Agent, or Firm*—Knobbe Martens Olson & Bear LLP

(57) ABSTRACT

A substrate support plate transfer apparatus for fabricating an organic light emitting display is disclosed. In one embodiment, the apparatus includes a quartz plate transferred into a bonding processing chamber for an organic light emitting device, a protection frame on which the quartz plate is placed in order to transfer the quartz plate into the chamber, and a frame-shaped supporting plate including a sliding transfer device for helping the transfer of the protection frame and installed in the chamber. The quartz plate has a rigidity capable of enduring pressure in the bonding process applied to a large sized substrate, and the apparatus provides for convenient replacement of the quartz plate.

20 Claims, 4 Drawing Sheets

FOREIGN PATENT DOCUMENTS

| | | |
|---|---|---|
| JP | 2003-323978 | 11/2003 |
| JP | 2004-172438 | 6/2004 |
| JP | 2004-317862 | 11/2004 |
| KR | 1020030005727 A | 1/2003 |
| TW | 557476 | 10/2000 |
| TW | 503445 | 9/2002 |
| TW | 561575 | 11/2003 |
| TW | 579564 | 3/2004 |

OTHER PUBLICATIONS

Office Action of Taiwanese Patent Application No. 095125212 dated Jul. 14, 2009.

* cited by examiner

SUBSTRATE SUPPORT PLATE TRANSFER APPARATUS FOR FABRICATING ORGANIC LIGHT EMITTING DISPLAY

CROSS-REFERENCE TO RELATED APPLICATIONS

This application claims the benefit of Korean Patent Application No. 2005-69815, filed on Jul. 29, 2005, in the Korean Intellectual Property Office, the disclosure of which is incorporated herein by reference.

BACKGROUND OF THE INVENTION

1. Field of the Invention

The present invention relates to a substrate support plate transfer apparatus for fabricating an organic light emitting display, and more particularly, to a substrate support plate transfer apparatus for fabricating an organic light emitting display configured for the easy replacement of substrate support plates.

2. Description of the Related Technology

Generally, an organic light emitting display is a light emitting display configured to inject electrons from an electron injection electrode and holes from a hole injection electrode into a light emitting layer and to illuminate when excitons, formed when the injected electrons and the injected holes are combined, drop from an excited state to a ground state.

Driving methods of the organic light emitting displays are divided into a passive matrix type and an active matrix type. The passive matrix type of organic light emitting display is simple and its manufacturing method is also simple, but power consumption is high and it is difficult to increase the size of the display device. Larger devices use more wires, and more wires reduce the aperture ratio. Thus, for a small sized display device, a passive matrix type organic light emitting display may be used, and for a large sized display device, the active matrix type organic light emitting display is generally used.

However, in a conventional organic light emitting display, since material for the organic light emitting layer and the cathode electrode has low moisture tolerance and low oxidation resistance, display materials deteriorate over time. The deterioration generates a non-light emitting area called a "dark spot." The dark spot gradually expands toward the periphery, and eventually the entire display device does not emit light.

Thus, in order to solve the problem, an encapsulation process preventing exposure to moisture and oxygen is carried out. The process comprises pressing a device glass substrate and a sealed glass substrate in which organic light emitting devices are formed with a flat plate and bonding the plates with sealing resin.

Hereinafter, the conventional process of bonding the device glass substrate to the sealed glass substrate is described.

As shown in FIG. 1, a sealed glass substrate 10 is loaded on a substrate support plate 30 and a device glass substrate 1 is suctioned to metal suction plates 20 disposed above the substrate support plate 30. Accordingly, an organic electroluminescent (EL) display device 2 formed on a principal surface of the device glass substrate 1 and a dryer layer 12 formed on a principal surface of the sealed glass substrate 10 are positioned so as to face each other. The suction plate 20 is lowered by a non-depicted moving device, and the suction plate 20 presses the device glass substrate 1 until the distance between the device glass substrate 1 and the sealed glass substrate 10 becomes a predetermined gap G. A UV projection device 40 disposed at the back of the substrate support plate 30 projects UV radiation through the substrate support plate 30 and the sealed glass substrate 10 to the sealing resin 13. In response, the sealing resin 13 hardens so that bonding between the device glass substrate 1 and the sealed glass substrate 10 is completed. As a result, the device glass substrate 1 is bonded to the sealed glass substrate 10, and the organic EL display device 2 formed on the device glass substrate 1 is protected from exposure to, for example, external moisture. This bonding process conventionally occurs within a bonding chamber (not shown), and in order to replace the substrate support plate 30, the bonding chamber is disassembled.

Desirable properties of the substrate support plate 30 are at least that it has sufficient mechanical strength to withstand the pressure applied as the device glass substrate 1 and the sealed glass substrate 10 are pressed toward one another, and that it has sufficient mechanical strength to withstand incidental mechanical impacts which commonly occur when transferring the substrate support plate 30 to or from the bonding chamber. Additionally it is desirable that the substrate support plate 30 have high transmission of the ultraviolet radiation used for hardening the sealing resin 13. As substrate sizes increase, in order to have sufficient mechanical strength the thickness of the substrate support plate 30 also increases. This, of course, reduces the transmission capabilities of the substrate support plate 30 and increases cost. Conventional embodiments of the substrate support plate are made from quartz, but other materials may also be used.

SUMMARY OF CERTAIN IN INVENTIVE ASPECTS

Accordingly, a quartz plate enduring pressure during the bonding process applied to a large sized substrate, and a quartz plate transfer apparatus enabling easy replacement of the quartz plate and easy maintenance thereof are disclosed.

One embodiment is a substrate support plate transfer apparatus configured for use in fabricating an organic light emitting display. The apparatus includes a protection frame, and a substrate support plate configured to slidably engage with the protection frame, the support plate including a sliding transfer device configured to be attached to a bonding chamber, and to allow the protection frame to be moved substantially into and out of the bonding chamber.

Another embodiment is a method of manufacturing a substrate support plate transfer apparatus configured for use in fabricating an organic light emitting display, the method including forming a protection frame, where the protection frame is configured to slide to permit transfer of the substrate support plate into a bonding chamber.

BRIEF DESCRIPTION OF THE DRAWINGS

These and/or other objects and advantages of aspects of the invention will become apparent and more readily appreciated from the following description of certain embodiments, taken in conjunction with the accompanying drawings of which.

DETAILED DESCRIPTION OF CERTAIN INVENTIVE EMBODIMENTS

Certain embodiments will be described with reference to the attached drawings. However, various modifications, additions and substitutions of the present invention are possible, without departing from the scope and spirit of the invention and the present invention is not limited to the described embodiments.

Figure 1:
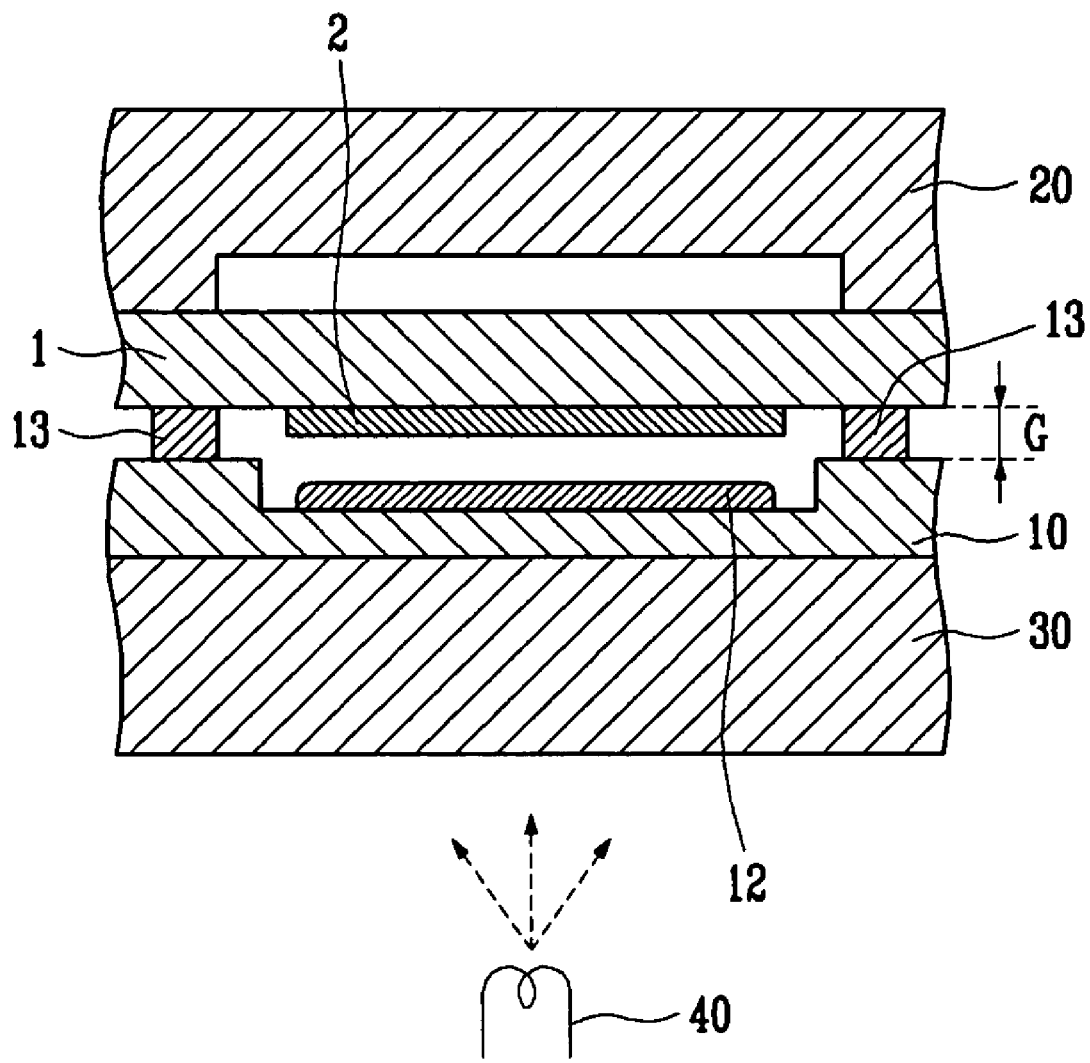
FIG. 1 is a schematic view illustrating a structure for encapsulation of a conventional organic light emitting display.
Figure 2:
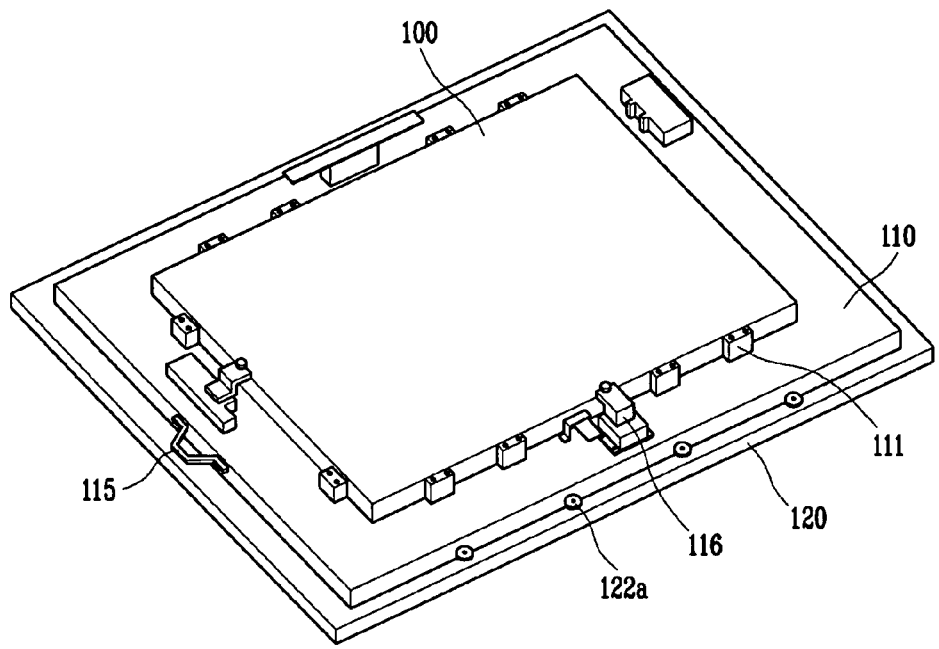
FIGS. 2 and 3 are perspective views illustrating a quartz plate transfer apparatus according to one embodiment.

FIG. 2 is a perspective view illustrating a substrate support plate transfer apparatus according to one embodiment. The substrate support plate transfer apparatus supports a substrate support plate 100 (generally called a "quartz") in order to safely transfer the substrate support plate 100 to and from a bonding chamber (not shown). The substrate support plate transfer apparatus comprises a protection frame 110 on which the substrate support plate 100 is placed, and a supporting plate 120 configured to be attached to the bonding chamber and having a sliding transfer device configured to smoothly transfer the protection frame 110 and the substrate support plate 100 to and from the bonding chamber.

As described above, the substrate support plate 100 is used in the process of bonding a device glass substrate to a sealed glass substrate within the bonding chamber. Unlike the conventional technology, the substrate support plate 100 is fixed in the chamber and the bonding processing chamber is not disassembled when replacing the substrate support plate 100, but is transferred into the chamber in a state of being loaded on the protection frame 110. Thus, the substrate support plate 100 is easily and safely installed.

Figure 5:
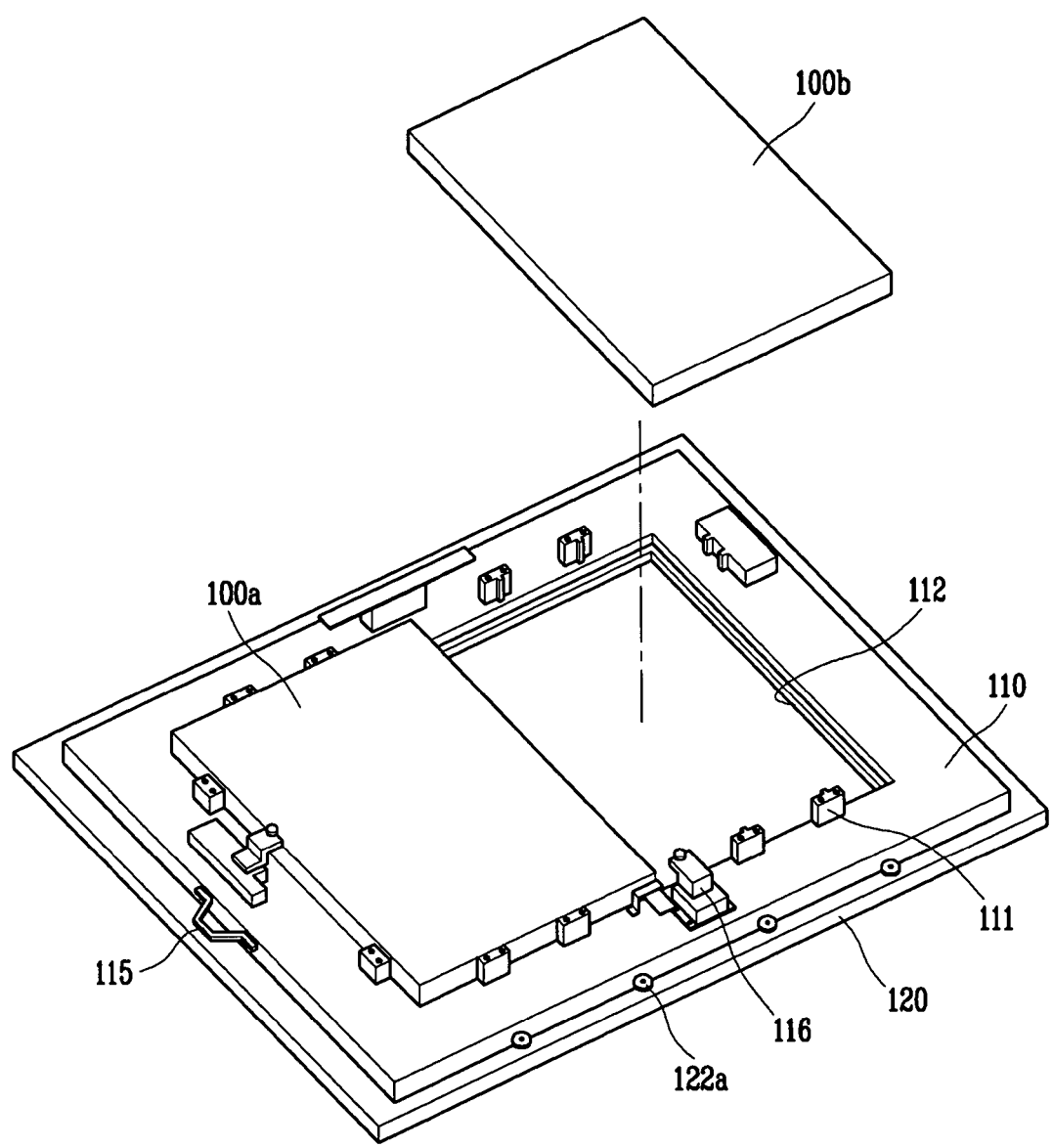
FIG. 5 is an exploded perspective view illustrating the quartz plate transfer apparatus shown in FIGS. 2-4.

The protection frame 110 is made in the form of a frame in which a hole is formed in the central portion where the substrate support plate 100 is placed such that the UV projection is carried out through the substrate support plate 100. The hole is smaller than the substrate support plate 100 such that the substrate support plate 100 can be placed thereon. Moreover, in the protection frame 110, as shown in FIG. 5, a step 112 is formed in the hole 113 such that the substrate support plate 100 can be loaded and the loaded substrate support plate 100 can be steadily fixed. The size of the step 112 is not limited to a specific size and may be formed in different sizes according to the size of the substrate support plate 100.

Moreover, on the upper side of the protection frame 110, a plurality of suction parts 111 for suctioning a substrate when performing a bonding process may be installed. As shown in the drawings, the suction part 111 is preferably installed along the perimeter of the substrate support plate 100. Moreover, near the transverse middle portion of the substrate support plate 100, a device 116 for centering a glass substrate is installed.

Figure 3:
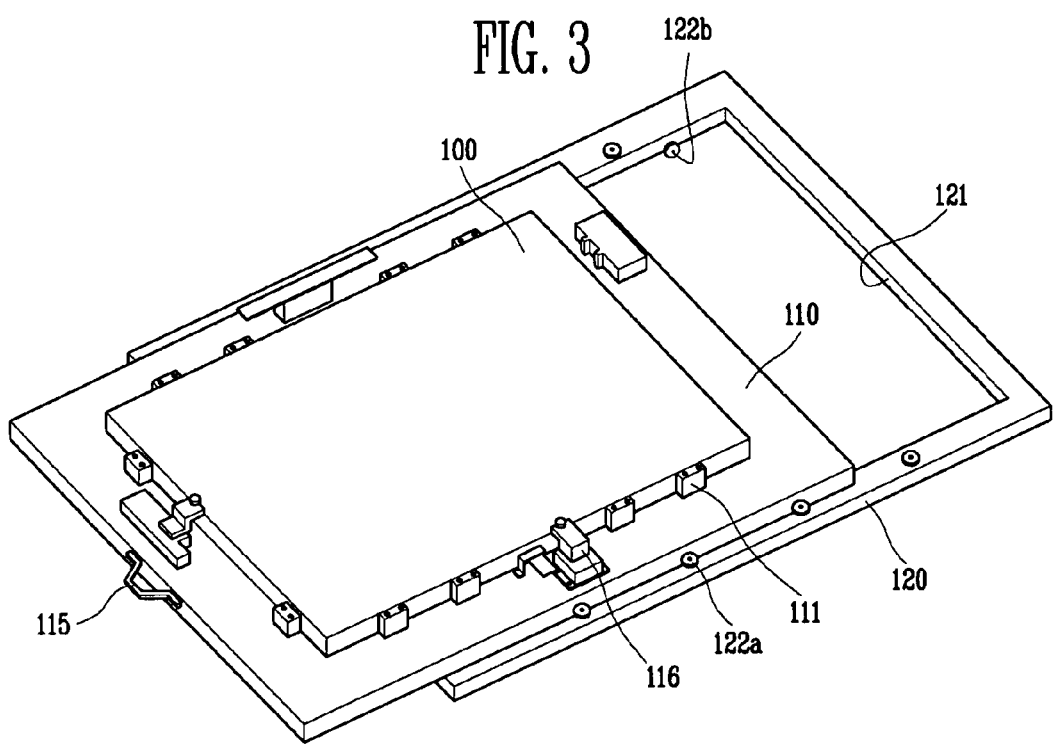

The protection frame 110, as shown in FIG. 3, is transferred into the chamber in a state of having the the substrate support plate 100 loaded thereon so that the substrate support plate 100 can be safely installed and removed from the chamber. Additionally, to enable a worker to easily transfer the protection frame 110, a handle 115 is provided at a side of the protection frame 110.

Figure 4:
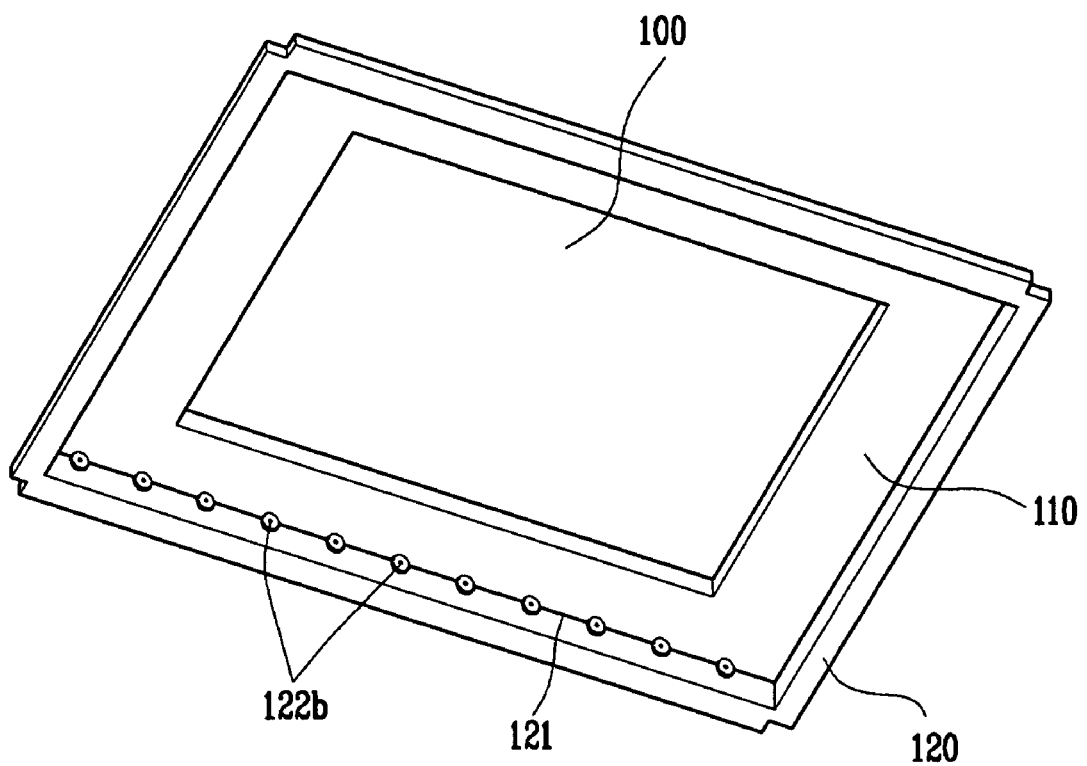
FIG. 4 is a perspective view illustrating a bottom view of the quartz plate transfer apparatus shown in FIGS. 2 and 3.

The supporting plate 120 is also installed in the chamber, and like the protection frame 110, in order to allow the UV radiation to pass to and through the substrate support plate 100, the supporting plate 120 has a hole 121 formed in the central portion where the substrate support plate 100 is placed (See FIG. 4). The supporting plate 120 also has a sliding transferring device for helping the transfer of the protection frame 110.

One embodiment of the sliding transfer device includes a plurality of rollers installed in the supporting plate 120 so as to contact the protection frame 110 and to guide the transfer of the protection frame 110 into and out of the bonding chamber.

The rollers include first rollers 122a installed in parallel relation to the upper side of the supporting plate 120 so as to contact the lateral side of the protection frame 110, and second rollers 122b vertically installed in the hole 121 of the supporting plate 120 so as to contact the lower side of the protection frame 110.

Accordingly, the first rollers 122a are positioned to contact the lateral side of the protection frame 110 when the protection frame 110 is placed on the upper side of the supporting plate 120. Also, in the inner side of the hole 121 of the supporting plate 120, as shown in FIG. 4, the second rollers 122b are vertically installed so as to contact the lower side of the protection frame 110 when the protection frame 110 is placed on the upper side of the supporting plate 120. The first and second rollers 122a and 122b are configured to turn as the protection frame 110 is transferred into and out of the bonding chamber so as to facilitate smooth and safe installation and removal of the substrate support plate 100.

In some embodiments, cams or cam followers are used as linearly moving guide rollers. The cam follower may have a compact and high rigid shaft-attached bearing, and since its outer wheel directly contacts the counter-surface and rotates, the outer wheel may be heavy and may be designed to endure an impact load.

In the substrate support plate transfer apparatus according to one embodiment, because the whole protection frame 110 moves, the substrate support plate 100 is easily replaced. Moreover, because of the rollers, the substrate support plate 100 is more easily replaced and the maintenance is enhanced.

Additionally, in the conventional technology, there is difficulty due to weight and size when replacing a UV mask positioned on the substrate support plate 100, and there is difficulty due to the lack of space in the chamber. Easy mobility of the substrate support plate 100 using the rollers 122a and 122b in the above embodiment facilitates the replacement of the UV mask positioned on the substrate support plate 100 and prevents the substrate support plate from damage due to incidental impact when replacing the UV mask.

FIG. 5 is an exploded perspective view illustrating the substrate support plate transfer apparatus according to the preferred embodiment of the present invention. The substrate support plate may be split into two or more pieces 100a and 100b, as shown in FIG. 5. As such, a structure enduring more than 70 tons of pressure is possible.

As described above, according to the present invention, since the substrate support plates can be slid and transferred into the bonding chamber, the complication of disassembling the bonding chamber for the replacement of the substrate support plates is removed, incidents of damage to the substrate support plates can be reduced, and the maintenance process, such as the replacement of the substrate support plate is improved.

Moreover, since the substrate support plate, having rigidity capable of enduring pressure in the bonding process applied to a large sized substrate, can be provided, the substrate support plate transfer apparatus can be implemented in the bonding process for large sized substrates.

Although the preferred embodiments of the present invention have been disclosed for illustrative purposes, those skilled in the art will appreciate that various modifications, additions and substitutions are possible, without departing from the scope and spirit of the invention. For example, various roller configurations may be implemented, such as having rollers placed on the protection frame in addition to or instead of on the supporting plate.

What is claimed is:

1. A substrate support plate transfer apparatus for fabricating an organic light emitting display in a bonding chamber, the bonding chamber comprising a supporting plate configured to support the substrate support plate transfer apparatus, the apparatus comprising:
   a substrate support plate, configured to support first and second substrates of the organic light emitting display while the first and second substrates are bonded together; and
   a protection frame configured to receive the substrate support plate and configured to slidably engage with the supporting plate of the bonding chamber, wherein the substrate support plate is configured to be moved substantially into and out of the bonding chamber by sliding the protection frame,
   wherein the protection frame comprises a plurality of suction elements positioned adjacent to perimeter portions of an opening for the substrate support plate and first and second centering devices positioned adjacent to perimeter portions of the opening on first and second sides of the opening, respectively.

2. The substrate support plate transfer apparatus as claimed in claim 1, wherein the supporting plate comprises a plurality of rollers and the protection frame is configured to engage the rollers so as to be guided by the rollers while sliding.

3. The substrate support plate transfer apparatus as claimed in claim 2, wherein the plurality of rollers comprise first rollers installed in parallel relation to the upper surface of the supporting plate so as to contact the lateral side of the protection frame, and second rollers vertically installed in a hole of the supporting plate so as to contact the lower side of the protection frame.

4. The substrate support plate transfer apparatus as claimed in claim 2, wherein the rollers comprise cam followers.

5. The substrate support plate transfer apparatus as claimed in claim 1, wherein the protection frame includes a step configured to engage the substrate support plate.

6. The substrate support plate transfer apparatus as claimed in claim 1, wherein the protection frame includes a handle.

7. The substrate support plate transfer apparatus as claimed in claim 1, wherein the protection frame is configured to receive one or more substrate support plate pieces.

8. The substrate support plate transfer apparatus as claimed in claim 1, wherein the suction elements are configured to suction a substrate to the substrate support plate.

9. The substrate support plate transfer apparatus as claimed in claim 1, wherein the protection frame comprises rollers.

10. The substrate support plate transfer apparatus as claimed in claim 9, wherein the rollers comprise cam followers.

11. A substrate support plate transfer apparatus for fabricating an organic light emitting display, the apparatus comprising:
    a protection frame configured to support a substrate support plate and to slide the substrate support plate into and out of a bonding chamber, wherein the substrate support plate is configured to support first and second substrates of the organic light emitting display while the first and second substrates are bonded together in the bonding chamber,
    wherein the protection frame comprises a plurality of suction elements positioned adjacent to perimeter portions of an opening for the substrate support plate and first and second centering devices positioned adjacent to perimeter portions of the opening on first and second sides of the opening, respectively.

12. The substrate support plate transfer apparatus as claimed in claim 11, wherein the protection frame includes a step configured to engage the substrate support plate.

13. The substrate support plate transfer apparatus as claimed in claim 11, wherein the protection frame comprises a handle.

14. The substrate support plate transfer apparatus as claimed in claim 11, wherein the protection frame is configured to receive one or more substrate support plate pieces.

15. The substrate support plate transfer apparatus as claimed in claim 11, comprising a plurality of suction elements configured to suction a substrate.

16. A method of manufacturing a substrate support plate transfer apparatus for fabricating an organic light emitting display in a bonding chamber, the bonding chamber comprising a supporting plate configured to support the substrate support plate transfer apparatus, the method comprising:
    forming a substrate support plate, configured to support first and second substrates of the organic light emitting display while the first and second substrates are bonded together; and
    forming a protection frame configured to be fixed to the substrate support plate and configured to slidably engage with the supporting plate of the bonding chamber, wherein the substrate support plate is configured to be moved substantially into and out of the bonding chamber by sliding the protection frame,
    wherein the protection frame comprises a plurality of suction elements positioned adjacent to perimeter portions of an opening for the substrate support plate and first and second centering devices positioned adjacent to perimeter portions of the opening on first and second sides of the opening, respectively.

17. The method of claim 16, further comprising forming a step in the protection frame, the step being configured to engage the substrate support plate.

18. The method of claim 16, further comprising forming a handle on the protection frame.

19. The method of claim 16, wherein the protection frame is configured to receive one or more substrate support plate pieces.

20. The method of claim 16, further comprising forming a plurality of suction elements, each suction element being configured to suction a substrate to the substrate support plate.

* * * * *